US 6,724,586 B2

(12) United States Patent
Gill

(10) Patent No.: US 6,724,586 B2
(45) Date of Patent: Apr. 20, 2004

(54) BIAS STRUCTURE FOR MAGNETIC TUNNEL JUNCTION MAGNETORESISTIVE SENSOR

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 403 days.

(21) Appl. No.: 09/819,357

(22) Filed: Mar. 27, 2001

(65) Prior Publication Data

US 2002/0141120 A1 Oct. 3, 2002

(51) Int. Cl.$^7$ ................................. G11B 5/127
(52) U.S. Cl. ...................................... 360/324.2
(58) Field of Search .................. 360/324.2–324.7, 360/313, 314, 317, 324.11, 324.12; 324/252

(56) References Cited

U.S. PATENT DOCUMENTS

| 5,452,163 | A | * | 9/1995 | Coffey et al. |
| 5,508,867 | A | | 4/1996 | Cain et al. |
| 5,576,915 | A | | 11/1996 | Akiyama et al. |
| 5,635,835 | A | | 6/1997 | Mouchot et al. |
| 5,677,625 | A | | 10/1997 | Dieny ......................... 324/252 |
| 5,986,858 | A | | 11/1999 | Sato et al. |
| 6,005,753 | A | | 12/1999 | Fontana, Jr. et al. |
| 6,023,395 | A | | 2/2000 | Dill et al. |
| 6,052,263 | A | * | 4/2000 | Gill |
| 6,104,633 | A | | 8/2000 | Abraham et al. ............ 365/171 |
| 6,110,751 | A | | 8/2000 | Sato et al. ...................... 483/3 |
| 6,114,719 | A | | 9/2000 | Dill et al. .................... 257/295 |
| 6,185,079 | B1 | * | 2/2001 | Gill .......................... 360/324.2 |
| 6,256,178 | B1 | * | 7/2001 | Gill .......................... 360/324.2 |
| 6,259,586 | B1 | * | 7/2001 | Gill .......................... 360/324.2 |
| 6,473,275 | B1 | * | 10/2002 | Gill ............................. 360/314 |

OTHER PUBLICATIONS

H.S. Gill "Dual Tunnel Sensor With a Single Antiferromagnetic Layer" Filed: Mar. 29, 1999, Appl. No. 09/280,291.

* cited by examiner

Primary Examiner—Allen Cao
(74) Attorney, Agent, or Firm—Ronald B. Feece; William D. Gill

(57) ABSTRACT

An antiparallel (AP)-pinned magnetoresistive tunnel junction (MTJ) sensor is provided with a single antiferromagnetic (AFM) layer sandwiched between an AP-pinned layer and a bias layer for pinning the magnetization directions of the AP-pinned layer and the bias layer. The bias layer may be a simple ferromagnetic bias layer or, alternatively, may be an AP-pinned bias layer including first and second ferromagnetic bias layers with an antiferromagnetic coupling layer sandwiched between. The bias layer provides a demagnetization field $H_{dmB}$ at the free layer having the same direction as the demagnetization field $H_{dmP}$ from the AP-pinned layer. The sum of $H_{dmP}$ and $H_{dmB}$ counterbalance a ferromagnetic coupling field $H_{FC}$ from the AP-pinned layer to obtain zero or near zero asymmetry of the bias point on the transfer curve of the MTJ sensor.

30 Claims, 11 Drawing Sheets

BIAS STRUCTURE FOR MAGNETIC TUNNEL JUNCTION MAGNETORESISTIVE SENSOR

BACKGROUND OF THE INVENTION

1. Field of the Invention

This invention relates in general to magnetic tunnel junction transducers for reading information signals from a magnetic medium and, in particular, to a magnetic tunnel junction magnetoresistive sensor with an improved bias layer structure.

2. Description of the Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., copper) are generally referred to as spin valve (SV) sensors manifesting the SV effect. FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Leads 140 and 145 formed in the end regions 104 and 106, respectively, provide electrical connections for sensing the resistance of SV sensor 100. IBM's U.S. Pat. No. 5,206,590 granted to Dieny et al., incorporated herein by reference, discloses a SV sensor operating on the basis of the GMR effect.

Another type of SV sensor is an antiparallel (AP)-pinned SV sensor. In AP-pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-pinned SV sensor provides improved exchange coupling of the antiferromagnetic (AFM) layer to the laminated pinned layer structure than is achieved with the pinned layer structure of the SV sensor of FIG. 1. This improved exchange coupling increases the stability of the AP-pinned SV sensor at high temperatures which allows the use of corrosion resistant and electrically insulating antiferromagnetic materials such as NiO for the AFM layer.

Another type-of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetization fixed, or pinned, and the other ferromagnetic layer has its magnetization free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2 shows a prior art MTJ sensor 200 comprising a first electrode 204, a second electrode 202, and a tunnel barrier 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of the arrow that is pointing into the plane of the paper). A first lead 260 and a second lead 265 formed in contact with first electrode 204 and second electrode 202, respectively, provide electrical connections for the flow of sensing current $I_s$ from a current source 270 to the MTJ sensor 200. A signal detector 280, typically including a recording channel such as a partial-response maximum-likelihood (PRML) channel, connected to the first and second leads 260 and 265 senses the change in resistance due to changes induced in the free layer 210 by the external magnetic field.

As mentioned earlier, an MR sensor exhibits a change in resistance when in the presence of a changing magnetic field. This resistance change is transformed into a voltage signal by passing a constant sense current through the MR element. The value of the DC voltage for a given MR sensor is the product of the constant sense current and the total resistance between the MR sensor leads. Since the change in the resistance is the principal upon which the MR sensor operates, the change in resistance can substantially effect the performance of the MR sensor and the disk drive incorporating the MR sensor.

The transfer curve (readback signal of the MTJ head versus applied signal from the magnetic disk) for an MTJ sensor is linear and is defined by sin θ where θ is the angle between the directions of the magnetizations of the free and pinned layers. FIG. 3a is an exemplary transfer curve for an MTJ sensor having a bias point (operating point) 300 at the midpoint of the transfer curve, at which point the positive and negative readback signals $V_1$ and $V_2$ (positive and negative changes in the GMR of the MTJ sensor above and below the bias point) are equal (symmetrical) when sensing positive and negative fields having the same magnitude from the magnetic disk. FIGS. 3b and 3c illustrate transfer curves having bias points 302 and 304 shifted in the positive and negative directions, respectively, so that the readback signals $V_1$ and $V_2$ are asymmetrical with respect to the bias point.

The desirable symmetric bias transfer curve of FIG. 3a is obtained when the MTJ sensor is in its quiescent state (no magnetic signal from the disk) and the direction of the magnetization of the free layer is perpendicular to the magnetization of the pinned layer which is fixed substantially perpendicular to the disk surface. The bias point may be shifted from the midpoint of the transfer curve by various influences on the free layer which in the quiescent state can act to rotate its magnetization relative to the magnetization of the pinned layer.

The bias point is influenced by two major forces on the free layer, namely a ferromagnetic coupling field $H_{FC}$ between the pinned layer and the free layer, and a demagnetization field $H_{demag}$ on the free layer from the pinned layer. In a conventional spin valve sensor these coupling fields may be partially offset by the self-field provided by the sense current passing parallel to the layers of the sensor. In an MTJ sensor the current passes perpendicular to the sensor and cannot be used to provide such a field. IBM's U.S. Pat. No. 6,023,395 to Dill et al., incorporated herein by reference, discloses an MTJ sensor with in-stack biasing to stabilize the sensor and to provide bias point symmetry to linearize the output of the sensor.

As data storage density in disk drives increases, the need for thinner read sensors makes the use of AP-pinned MTJ sensors desirable since the AP-pinned structure promotes a stronger exchange interaction with the AFM layer allowing thinner AFM layers to be used. Therefore there is a need for an AP-pinned MTJ sensor with an improved transverse biasing structure to provide bias point symmetry with improved manufacturability.

SUMMARY OF THE INVENTION

Accordingly, it is an object of the present invention to disclose a antiparallel (AP)-pinned magnetic tunnel junction (MTJ) sensor having a free (sensing) layer, an AP-pinned layer, an electrically non-conductive tunnel barrier layer sandwiched between the free layer and the AP-pinned layer, a bias layer, and an antiferromagnetic (AFM) layer disposed between the AP-pinned layer and the bias layer.

It is another object of the present invention to disclose an AP-pinned MTJ sensor having a single AFM layer to pin the magnetizations of a pinned layer and of a bias layer for providing a transverse bias field at a free layer.

It is a further object of the present invention to disclose an AP-pinned MTJ sensor having an AP-pinned bias layer wherein a single AFM layer pins the magnetizations of the pinned layer and the bias layer.

It is yet a further object of the present invention to disclose an AP-pinned MTJ sensor having a bias layer to provide a transverse magnetic field at the free layer for obtaining zero or nearly zero signal asymmetry.

In accordance with the principles of the present invention, there is disclosed a preferred embodiment of the present invention wherein an AP-pinned MTJ sensor has a thin AFM layer and an AP-pinned layer with first and second ferromagnetic layers of different thickness coupled by an antiparallel coupling (APC) layer. The first ferromagnetic (FM1) layer is adjacent to the AFM layer and the thicker second ferromagnetic (FM2) layer is adjacent to an electrically insulating (non-conductive) tunnel barrier layer. A ferromagnetic free layer is adjacent to the spacer layer. An AP-pinned bias layer with first and second ferromagnetic bias layers of different thickness coupled by an APC layer is located on the side of the AFM layer opposite to the side adjacent to the AP-pinned layer. The second bias (B2) layer adjacent to the AFM layer is not as thick as the first bias (B1) layer.

Because the FM2 layer of the AP-pinned layer and the B1 layer of the AP-pinned bias layer are thicker than the FM1 and the B2 layers, respectively, the net magnetization of the AP-pinned layer is in the same direction as the net magnetization of the AP-pinned bias layer. A net demagnetization field $H_{dmP}$ from the AP-pinned layer acts on the free layer in the same direction as a net demagnetization field $H_{dmB}$ from the AP-pinned bias layer. The combined demagnetization fields $H_{dmP}+H_{dmB}$ are directed opposite to and oppose a ferromagnetic coupling field $H_{FC}$ from the FM2 layer of the AP-pinned layer acting on the free layer. The relative thicknesses of the FM1 and FM2 layers and the B1 an B2 layers, respectively, are chosen so that the sum of the demagnetization fields $H_{dmP}+H_{dmB}$ counterbalance the ferromagnetic coupling field $H_{FC}$ to obtain zero or near zero asymmetry of the bias point on the transfer curve of the MTJ sensor.

Having a single AFM layer pinning the magnetization directions of both the AP-pinned layer and the bias layer provides a further advantage in improving the manufacturability of the MTJ sensor by only requiring setting the magnetization of a single AFM material during the fabrication process.

The above as well as additional objects, features, and advantages of the present invention will become apparent in the following detailed description.

BRIEF DESCRIPTION OF THE DRAWINGS

For a fuller understanding of the nature and advantages of the present invention, as well as of the preferred mode of use, reference should be made to the following detailed description read in conjunction with the accompanying drawings. In the following drawings, like reference numerals desigate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 4:
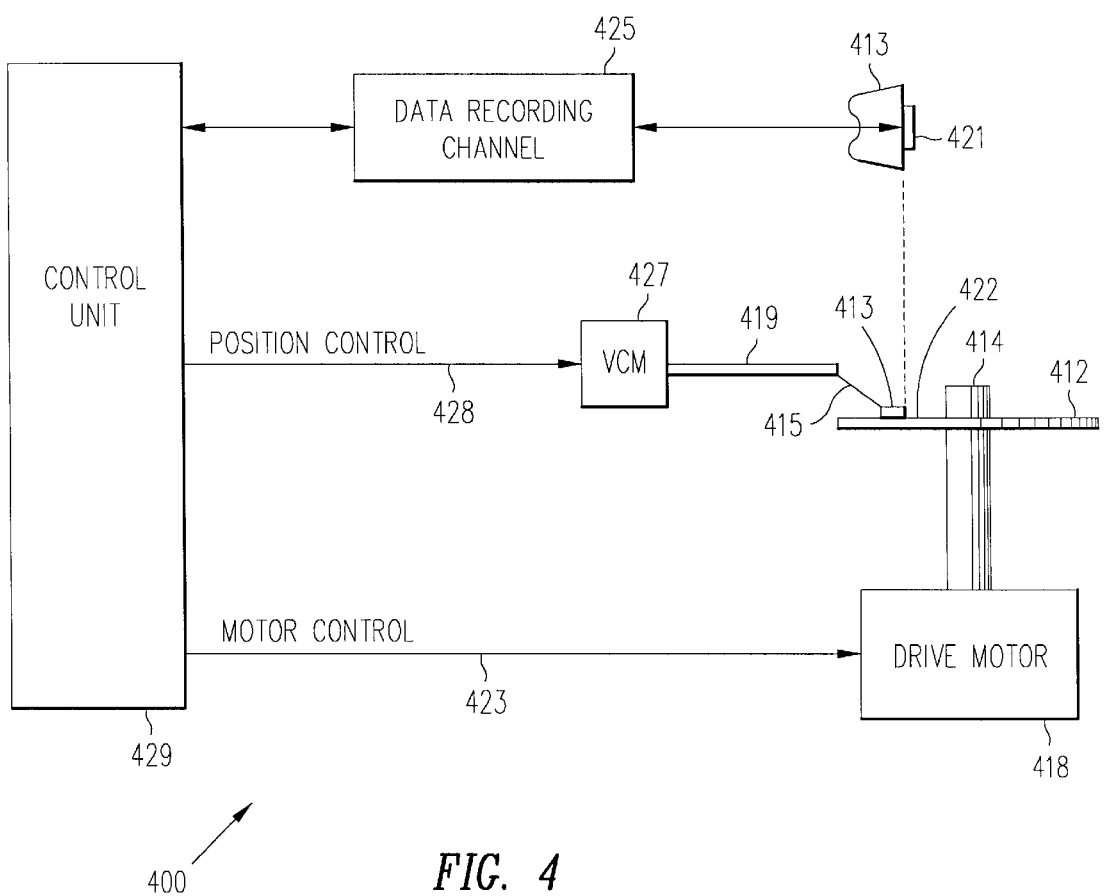
FIG. 4 is a block diagram of a magnetic recording disk drive system.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on the disk 412.

At least one slider 413 is positioned on the disk 412, each slider 413 supporting one or more magnetic read/write heads 421 where the head 421 incorporates the MTJ sensor of the present invention. As the disks rotate, the slider 413 is moved radially in and out over the disk surface 422 so that the heads 421 may access different portions of the disk where desired data is recorded. Each slider 413 is attached to an actuator arm 419 by means of a suspension 415. The suspension 415 provides a slight spring force which biases the slider 413 against the disk surface 422. Each actuator arm 419 is attached to an actuator 427. The actuator as shown in FIG. 4 may be a voice coil motor (VCM). The VCM comprises a coil movable within a fixed magnetic field, the direction and speed of the coil movements being controlled by the motor current signals supplied by a controller 429.

During operation of the disk storage system, the rotation of the disk 412 generates an air bearing between the slider 413 (the surface of the slider 413 which includes the head 421 and faces the surface of the disk 412 is referred to as an air bearing surface (ABS)) and the disk surface 422 which exerts an upward force or lift on the slider. The air bearing thus counterbalances the slight spring force of the suspension 415 and supports the slider 413 off and slightly above the disk surface by a small, substantially constant spacing during normal operation.

The various components of the disk storage system are controlled in operation by control signals generated by the control unit 429, such as access control signals and internal clock signals. Typically, the control unit 429 comprises logic control circuits, storage chips and a microprocessor. The control unit 429 generates control signals to control various system operations such as drive motor control signals on line 423 and head position and seek control signals on line 428. The control signals on line 428 provide the desired current profiles to optimally move and position the slider 413 to the desired data track on the disk 412. Read and write signals are communicated to and from the read/write heads 421 by means of the data recording channel 425. Recording channel 425 may be a partial response maximum likelihood (PMRL) channel or a peak detect channel. The design and implementation of both channels are well known in the art and to persons skilled in the art. In the preferred embodiment, recording channel 425 is a PMRL channel.

The above description of a typical magnetic disk storage system, and the accompanying illustration of FIG. 4 are for representation purposes only. It should be apparent that disk storage systems may contain a large number of disks and actuator arms, and each actuator arm may support a number of sliders.

Figure 5:
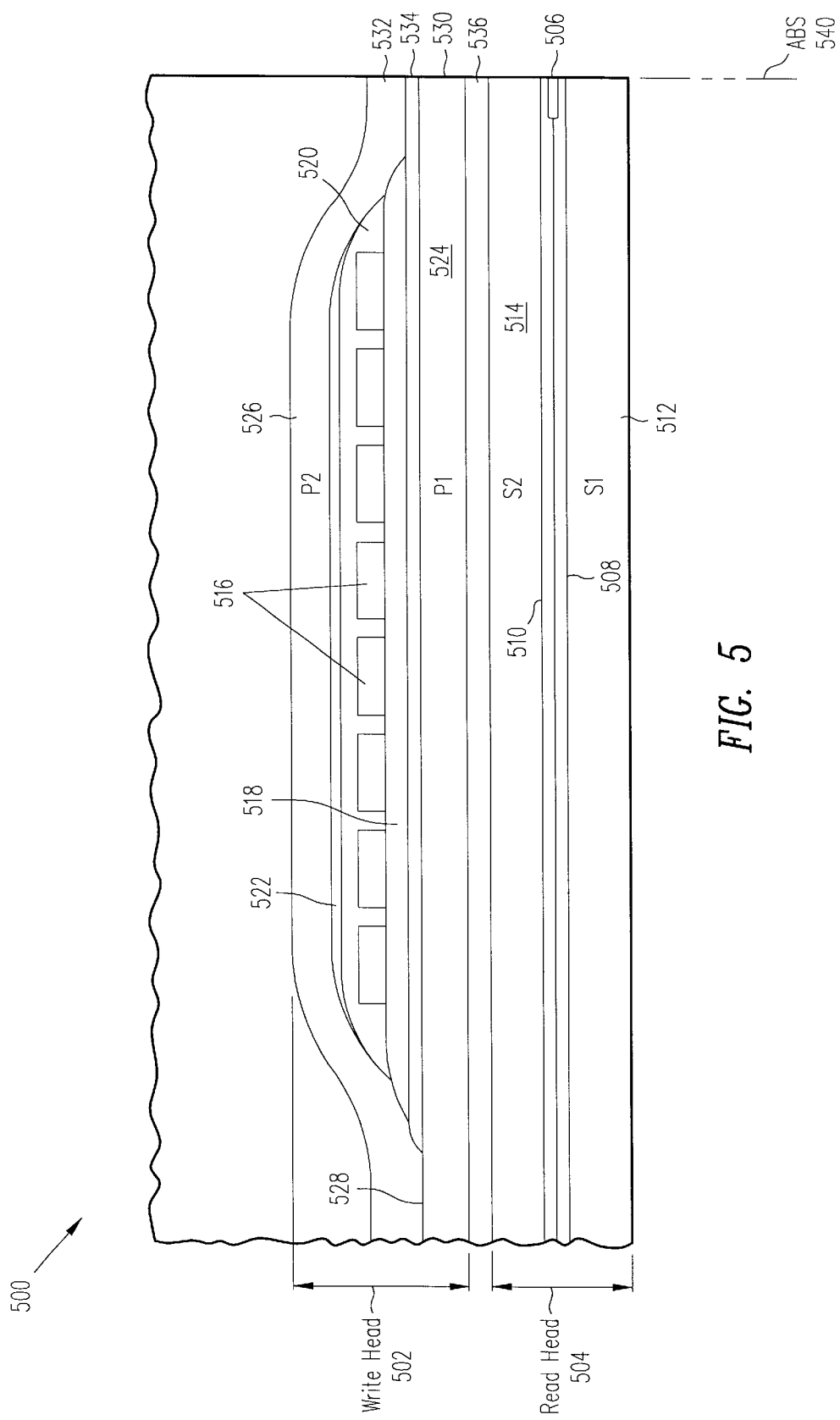
FIG. 5 is a vertical cross-section view (not to scale) of a "piggyback" read/write magnetic head.

FIG. 5 is a side cross-sectional elevation view of a "piggyback" magnetic read/write head 500, which includes a write head portion 502 and a read head portion 504, the read head portion employing an magnetic tunnel junction (MTJ) sensor 506 according to the present invention. The MTJ sensor 506 is sandwiched between nonmagnetic insulative first and second read gap layers 508 and 510, and the read gap layers are sandwiched between ferromagnetic first and second shield layers 512 and 514, or alternatively, the MTJ sensor 506 may be sandwiched between the first and second shield layers 512 and 514 which are used as electrodes for a sense current flow through the sensor. In response to external magnetic fields, the resistance of the MTJ sensor 506 changes. A sense current $I_s$ conducted through the sensor causes these resistance changes to be manifested as potential changes. These potential changes are then processed as readback signals by the processing circuitry of the data recording channel 425 shown in FIG. 4.

The write head portion 502 of the magnetic read/write head 500 includes a coil layer 516 sandwiched between first and second insulation layers 518 and 520. A third insulation layer 522 may be employed for planarizing the head to eliminate ripples in the second insulation layer 520 caused by the coil layer 516. The first, second and third insulation layers are referred to in the art as an insulation stack. The coil layer 516 and the first, second and third insulation layers 518, 520 and 522 are sandwiched between first and second pole piece layers 524 and 526. The first and second pole piece layers 524 and 526 are magnetically coupled at a back gap 528 and have first and second pole tips 530 and 532 which are separated by a write gap layer 534 at the ABS 540. An insulation layer 536 is located between the second shield layer 514 and the first pole piece layer 524. Since the second shield layer 514 and the first pole piece layer 524 are separate layers this read/write head is known as a "piggyback" head.

Figure 6:
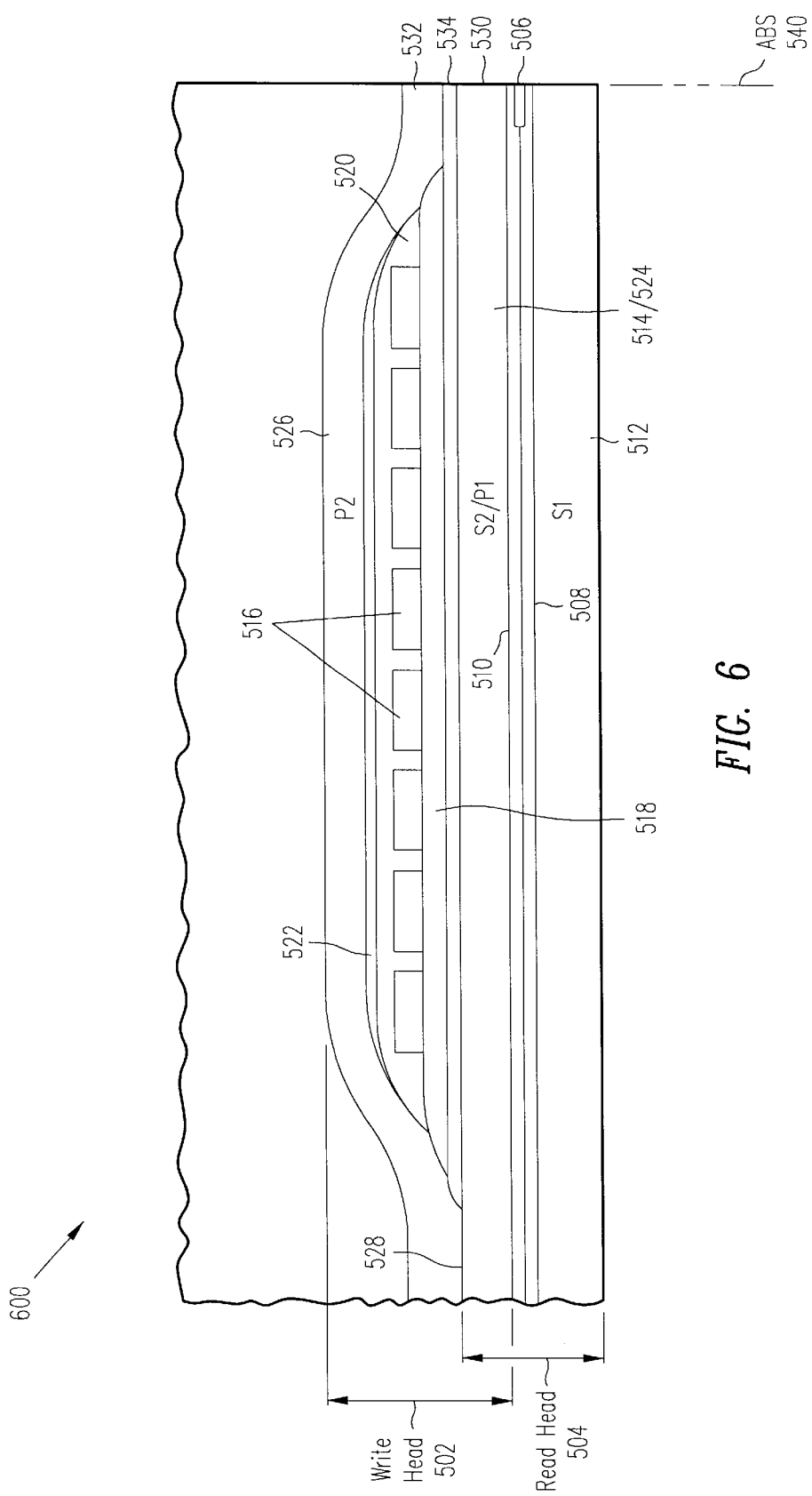
FIG. 6 is a vertical cross-section view (not to scale) of a "merged" read/write magnetic head.

FIG. 6 is the same as FIG. 5 except the second shield layer 514 and the first pole piece layer 524 are a common layer. This type of read/write head is known as a "merged" head 600. The insulation layer 536 of the piggyback head in FIG. 5 is omitted in the merged head 600 of FIG. 6.

Figure 7:
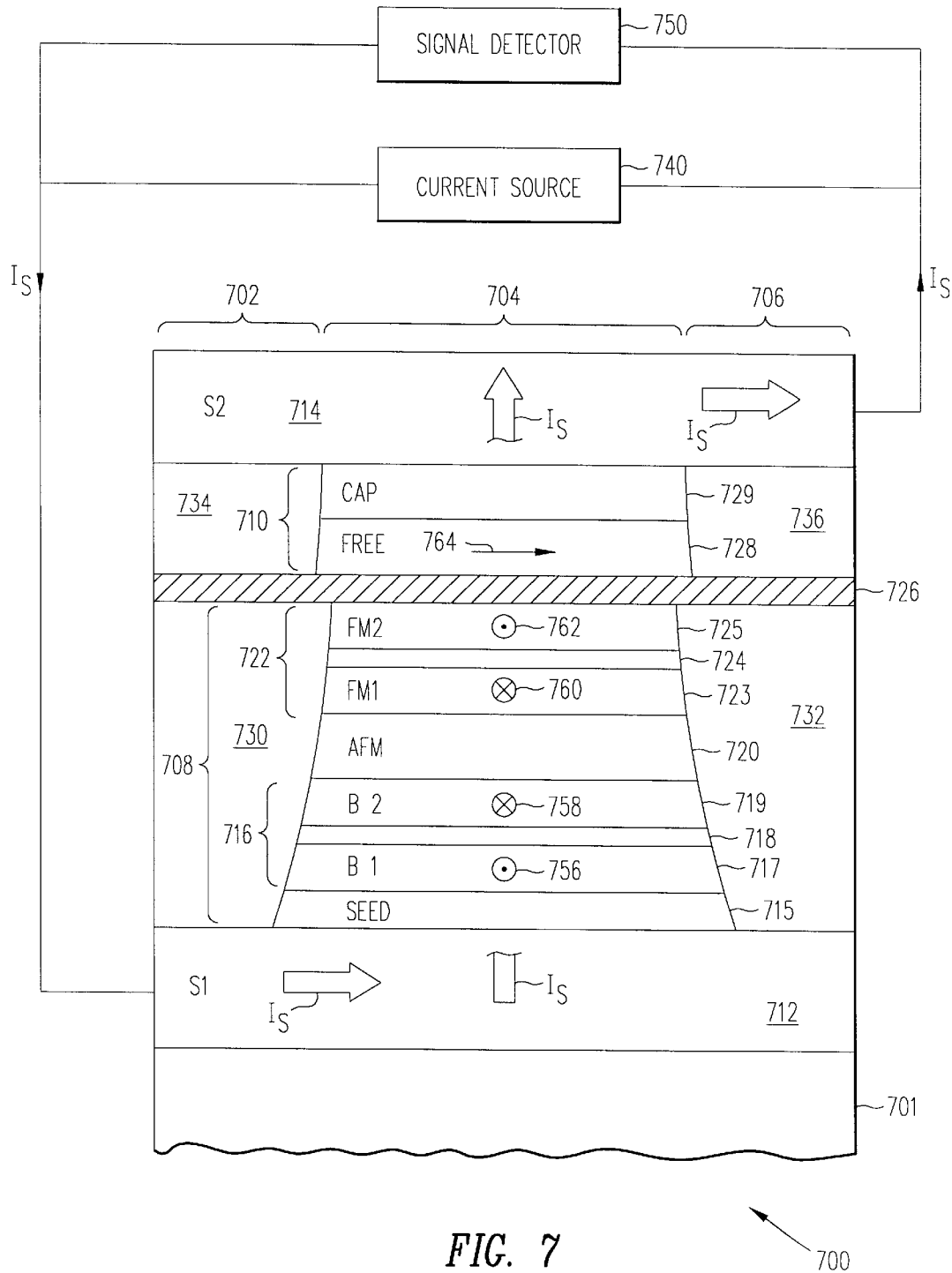
FIG. 7 is an air bearing surface view (not to scale) of an embodiment of an AP-pinned magnetic tunnel junction sensor of the present invention.

FIG. 7 shows an air bearing surface (ABS) view of an antiparallel (AP)-pinned MTJ sensor according to a first embodiment of the present invention. The MTJ sensor 700 comprises end regions 702 and 706 separated from each other by a central region 704. The active region of the MTJ sensor comprises a first electrode stack 708 and a second electrode stack 710 formed in the central region 704. The first and second electrode stacks 708 and 710 are separated by a tunnel barrier layer 726 which extends over the central region 704 and the end regions 702 and 706. Alternatively, the tunnel barrier layer 726 may be formed only in the central region 704. The first electrode stack 708 is formed directly on a first shield (S1) 712 in the central region 704. The first shield 712 is a layer of soft ferromagnetic material such as Ni—Fe (permalloy), or alternatively Al—Fe—Si (Sendust) deposited on a substrate 701 and extending over the central region 704 and end regions 702 and 706 to provide magnetic shielding of the MTJ sensor 700 from stray magnetic fields. The substrate 701 can be any suitable substance, including glass, semiconductor material, or a ceramic substance, such as alumina ($Al_2O_3$).

The first electrode stack 708 comprises an AP-pinned layer 722, an AP-pinned bias layer 716, an AFM layer 720 disposed between the AP-pinned layer 722 and the AP-pinned bias layer 716 and a seed layer 715. The seed layer 715 is a nonmagnetic metal layer deposited to modify the crystallographic texture or grain size of the subsequent layers and to magnetically isolate the AP-pinned bias layer 716 from the first shield layer 712. The AFM layer 720 is exchange coupled to the AP-pinned layer 722 and to the AP-pinned bias layer 716 providing exchange fields to pin the magnetization directions of the AP-pinned layer 722 and the AP-pinned bias layer 716 perpendicular to the ABS. The AP-pinned layer 722 comprises a first ferromagnetic (FM1) layer 723 adjacent to the AFM layer 720, a second ferromagnetic (FM2) layer 725 and an antiferromagnetic coupling (APC) layer 724 sandwiched between the FM1 and FM2 layers 723 and 725. The APC layer 724 is formed of a nonmagnetic material, preferably ruthenium (Ru), that allows the FM1 and FM2 layers 723 and 725 to be strongly coupled together antiferromagnetically. The AP-pinned bias layer 716 comprises a second ferromagnetic bias (B2) layer 719 adjacent to the AFM layer 720, a first ferromagnetic bias (B1) layer 717 and an antiferromagnetic coupling (APC) layer 718 sandwiched between the B1 and B2 layers 717 and 719. The APC layer 718 is formed of a nonmagnetic material, preferably ruthenium (Ru), that allows the B1 and B2 layers 717 and 719 to be strongly coupled together antiferromagnetically.

The second electrode stack 734 comprises a ferromagnetic free layer 728 adjacent to the tunnel barrier layer 726 and a cap layer 729. The magnetization 764 of the free layer 642 (shown as the tail of an arrow pointing into the plane of the paper) is oriented parallel to the ABS and is free to rotate in the presence of a magnetic field. Alternatively, the magnetization of the free layer may be oppositely directed to that shown in FIG. 7.

Insulator layers 730 and 732 of electrically insulating material such as $Al_2O_3$ are formed in the end regions 702 and 706, respectively, on the first shield 712 and in abutting contact with the first electrode stack 708. Similarly, insulator layers 734 and 736 of insulating material are formed in the end regions 702 and 706, respectively, on the tunnel barrier layer 726 and in abutting contact with the second electrode stack 710. A second shield 714 of soft ferromagnetic material such as Ni—Fe, or alternatively Al—Fe—Si, is formed over the insulator layers 734 and 736 in the end regions 702 and 706, respectively, and over the second electrode stack 710 in the central region 704.

If longitudinal stabilization of the magnetic domain states of the free layer 728 is desired, hard bias layers may be provided in the end regions 702 and 706 as is known in the art. IBM's U.S. Pat. No. 5,720,410 granted to Fontana et al., and incorporated herein by reference, describes such a longitudinal biasing method for an MTJ sensor.

The first and second shields 712 and 714 serve as leads providing electrical connections for the flow of a sensing current $I_s$ from a current source 740 to the MTJ sensor 700. A signal detector 750 which is electrically connected to the first and second shields 712 and 714 senses the change in resistance due to changes induced in the free layer 728 by the external magnetic field (e.g., field generated by a data bit stored on a disk). The external magnetic field acts to rotate the direction of magnetization of the free layer 728 relative to the direction of magnetization of the FM2 layer 725 which is preferably pinned perpendicular to the ABS. The signal detector 750 preferably comprises a partial response maximum liklihood (PMRL) recording channel for processing the signal detected by the MTJ sensor 700. Alternatively, a peak detect channel or a maximum liklihood channel (e.g., 1, 7 ML) may be used. The design and implementation of the aforementioned channels are known to those skilled in the art. The signal detector 750 also includes other supporting circuitries such as a preamplifier (electrically placed between the sensor and the channel) for conditioning the sensed resistance changes as is known to those skilled in the art.

The MTJ sensor 700 may be fabricated in a magnetron sputtering or an ion beam sputtering system to sequentially deposit the multilayer structure shown in FIG. 7. The first shield 712 of Ni—Fe having a thickness in the range of 5000–10000 Å is deposited on the substrate 701. The seed layer 715, the AP-pinned bias layer 716, the AFM layer 720 and the AP-pinned layer 722 are sequentially deposited over the first shield 712 in the presence of a longitudinal or transverse magnetic field of about 40 Oe to orient the easy axis of all the ferromagnetic layers. The seed layer 715 formed of a nonmagnetic metal, preferably tantalum (Ta), having a thickness of 30 Å is deposited on the first shield 712. The B1 layer 717 formed of Ni—Fe having a thickness in the range of 20–50 Å is deposited on the seed layer 715. The APC layer 718 preferably formed of ruthenium (Ru) having a thickness of about 6 Å is deposited on the B1 layer 717. The B2 layer 719 formed of Ni—Fe having a thickness in the range of 20–50 Å is deposited on the APC layer 718. The thickness of the B1 layer 717 is chosen to be greater than the thickness of the B2 layer 719 so that magnetization 756 (shown as the head of an arrow pointing out of the plane of the paper) of the B1 layer 717 is greater than the magnetization 758 (shown as the tail of an arrow pointing into the plane of the paper) of the B2 layer 719. As a result, the direction of the net magnetization of the AP-pinned bias layer 716 has the same direction as the magnetization 756 of the B1 layer 717. The AFM layer 720 formed of Pt—Mn having a thickness of 100–200 Å is deposited on the B2 layer 719. The FM1 layer 723 formed of Ni—Fe having a thickness in the range 20–50 Å is deposited on the AFM layer 720. The thickness of the FM2 layer 725 is chosen to be greater than the thickness of the FM1 layer 723 so that the magnetization 762 (shown as the head of an arrow pointing out of the plane of the paper) of the FM2 layer 725 is greater than the magnetization 760 (shown as the tail of an arrow pointing into the plane of the paper) of the FM1 layer 723. As a result, the direction of the net magnetization of the AP-pinned layer 722 has the same direction as the magnetization 762 of the FM2 layer 725. The APC layer 724 formed of Ru having a thickness of about 6 Å is deposited on the FM1 layer 723 and the FM2 layer 725 formed of Ni—Fe having a thickness in the range of 20–50 Å is deposited on the APC layer 724. Alternatively, the AFM layer 720 may be formed of Pt—Pd—Mn or Ir—Mn. If the AFM layer 720 is formed of Ir—Mn, the preferred thickness is in the range of 50–100 Å and the B1 and B2 layers 717 and 719 and the FM1 and FM2 layer 723 and 725 are preferably formed of Co—Fe.

The layers of the first electrode stack 708 are defined in the central region 704 by depositing a photoresist and using photolithography and ion milling processes well known in the art. The insulator layers 730 and 732 can now be deposited on the first shield 712 in the end regions 702 and 706, respectively. The insulator layers 730 and 732 are formed of $Al_2O_3$ having a thickness approximately equal to the thickness of the first electrode stack 708. The photoresist protecting the first electrode stack 708 is then removed and the tunnel barrier layer 726 is formed of $Al_2O_3$ by depositing and then plasma oxidizing an 8–20 Å aluminum (Al) layer on the FM2 layer 725 in the central region 704 and on the insulator layers 730 and 732 in the end regions 702 and 706.

The ferromagnetic free layer 728 formed of Ni—Fe having a thickness in the range of 20–40 Å is deposited on the tunnel barrier layer 726 in the presence of a longitudinal or transverse magnetic field of about 40 Oe to orient the easy axis of the ferromagnetic layer. Alternatively, the free layer 728 may be formed of a laminated multilayer comprising a ferromagnetic interface layer formed of cobalt (Co) having a thickness of about 5 Å deposited on the tunnel barrier layer 726 and a ferromagnetic layer formed of Ni—Fe having a thickness of 20–30 Å deposited on the interface layer. The cap layer 729 formed of tantalum (Ta) having a thickness of about 50 Å is deposited on the free layer 728.

The second electrode stack 710 is defined in the central region 704 by depositing a photoresist and using photolithography and ion milling processes well known in the art. The insulator layers 734 and 736 can now be deposited on the tunnel barrier layer 726 in the end regions 702 and 706, respectively. The insulator layers 734 and 736 are formed of $Al_2O_3$ having a thickness approximately equal to the thickness of the second electrode stack 710. The photoresist protecting the second electrode stack 710 is removed and the second shield 714 of Ni—Fe having a thickness in the range of 5000–10000 Å is formed on the cap layer 729 in the central region 704 and on the insulator layers 734 and 736 in the end regions 702 and 706, respectively.

Figure 8:
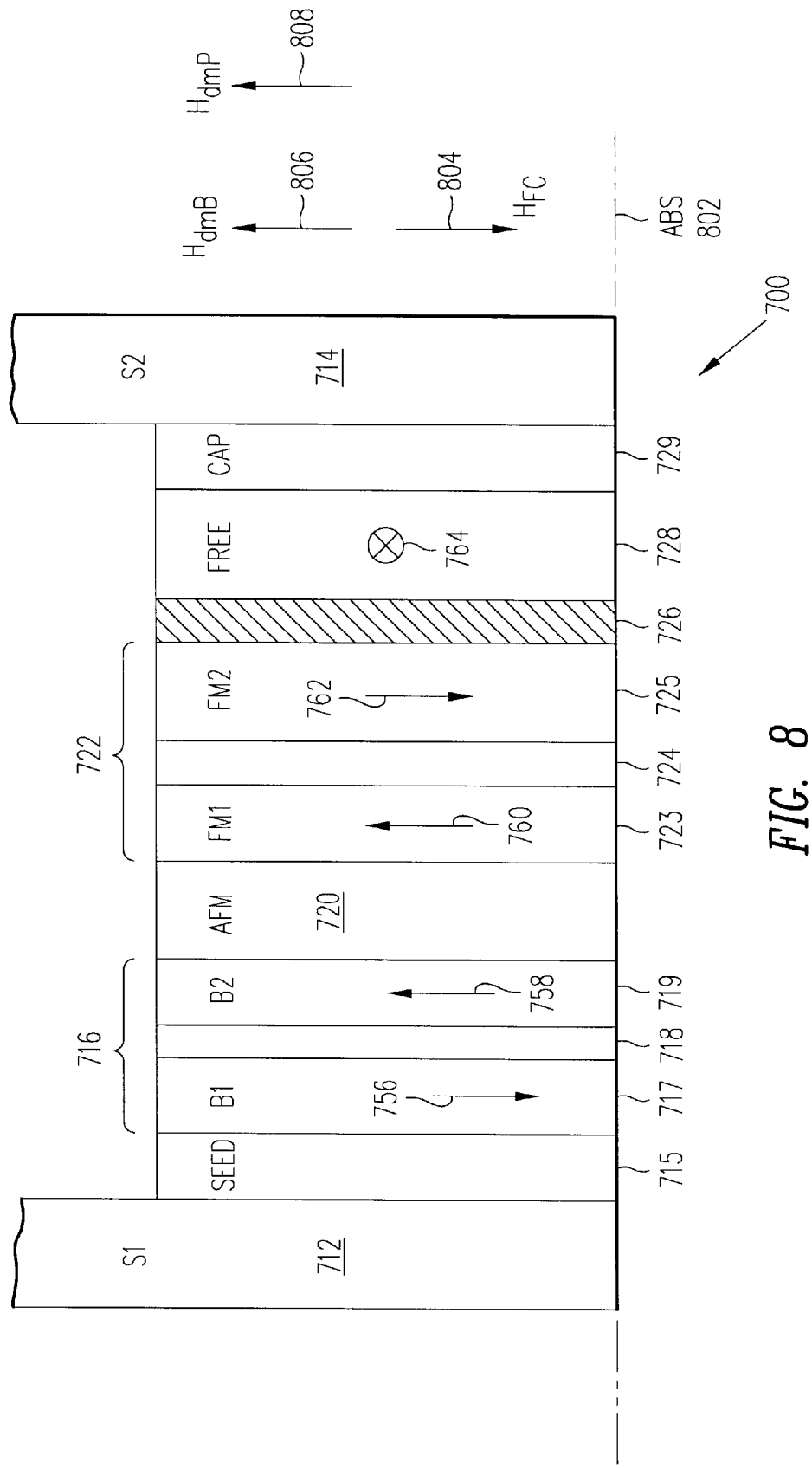
FIG. 8 is a side cross-section view (not to scale) of a first embodiment of an AP-pinned magnetic tunnel junction sensor of the present invention.

FIG. 8 shows a side cross-section view, not to scale, of the first embodiment of the AP-pinned MTJ sensor 700 of the present invention. The AFM layer 720 has its magnetization set so that the magnetization directions 758 and 760 of the B2 and FM1 layers 719 and 723, respectively, are directed in the same direction away from the ABS. The magnetization direction 762 of the FM2 layer 725 is antiparallel to the magnetization direction 760 of the FM1 layer 723 due to the APC layer 724 which causes the FM1 and FM2 layers to be strongly antiferromagnetically coupled. The magnetization direction 756 of the B1 layer 717 is antiparallel to the magnetization direction 758 of the B2 layer 719 due to the APC layer 718 which causes the B1 and B2 layers to be strongly antiferromagnetically coupled. Since the FM2 layer 725 is chosen to have a greater thickness than the FM1 layer 723 and the B1 layer 717 is chosen have a greater thickness than the B2 layer 719, the net magnetizations of the AP-pinned layer 722 and the AP-pinned bias layer 716 have the same direction toward the ABS 802.

Figure 1:
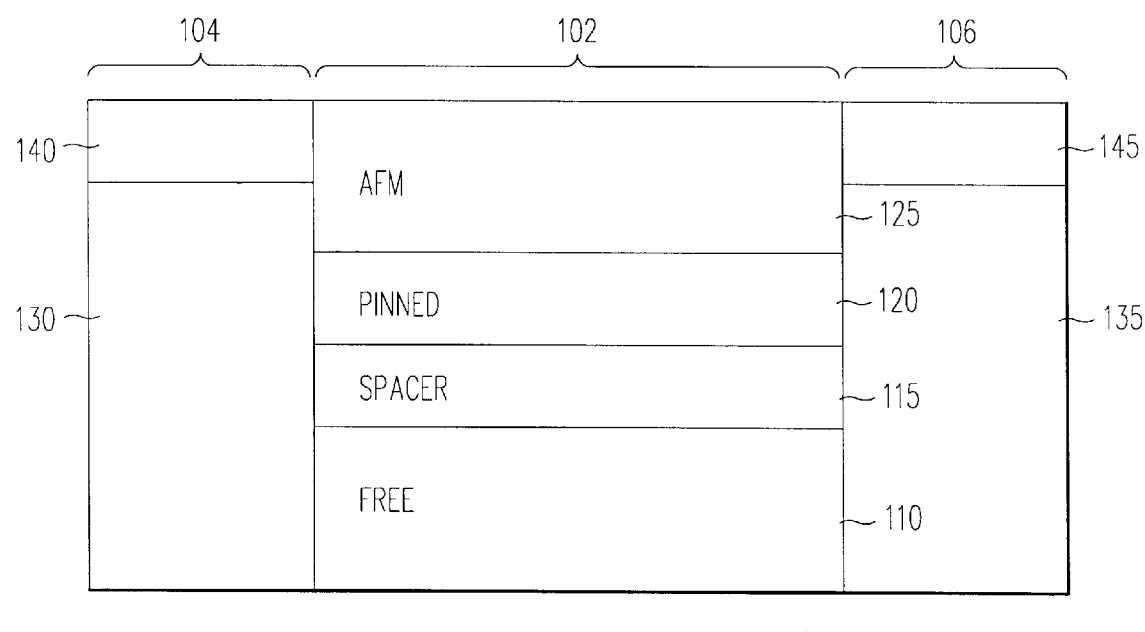
FIG. 1 is an air bearing surface view, not to scale, of a prior art SV sensor.
Figure 2:
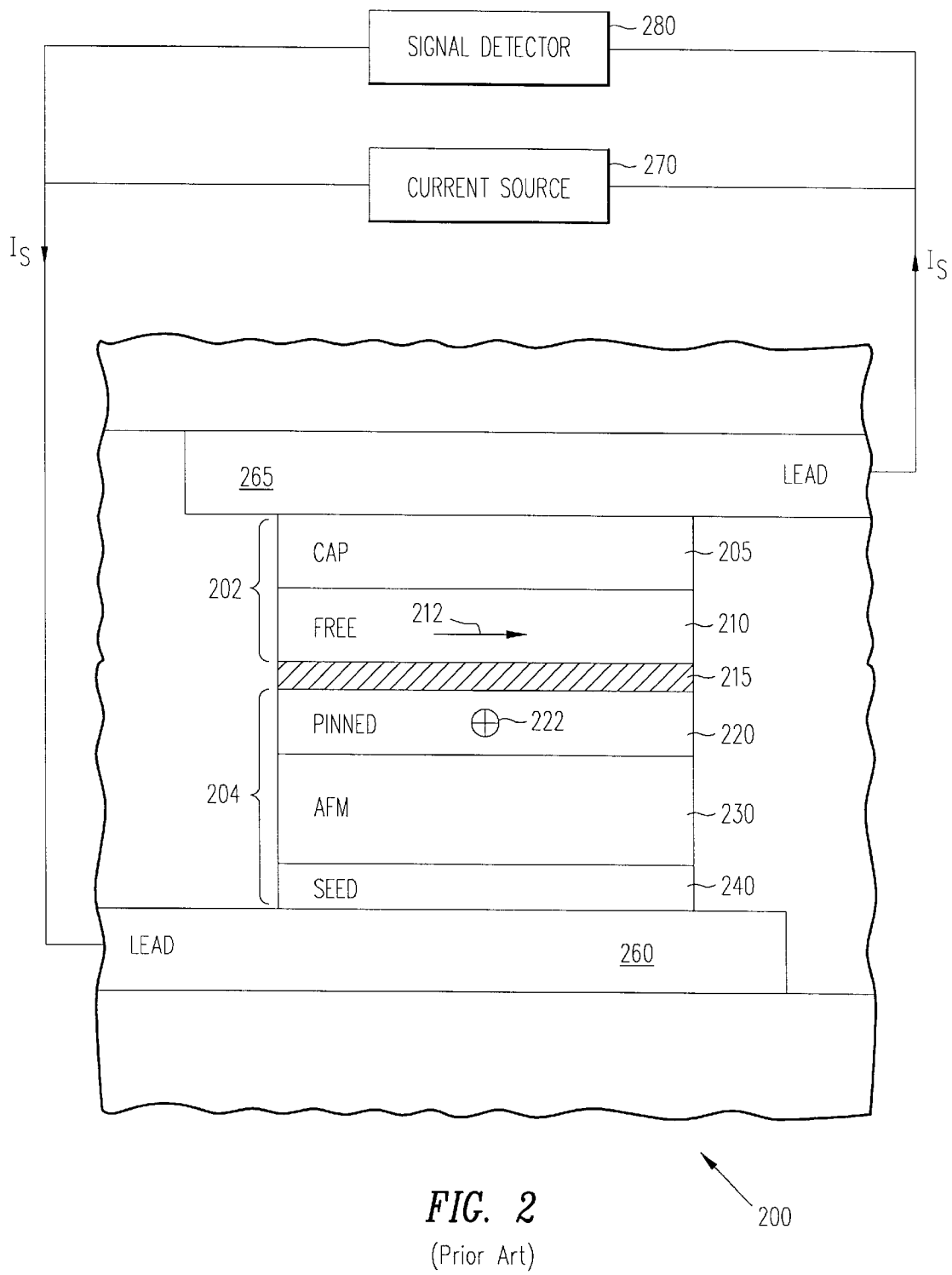
FIG. 2 is an air bearing surface view not to scale, of a prior art magnetic tunnel junction sensor.
Figure 3C:
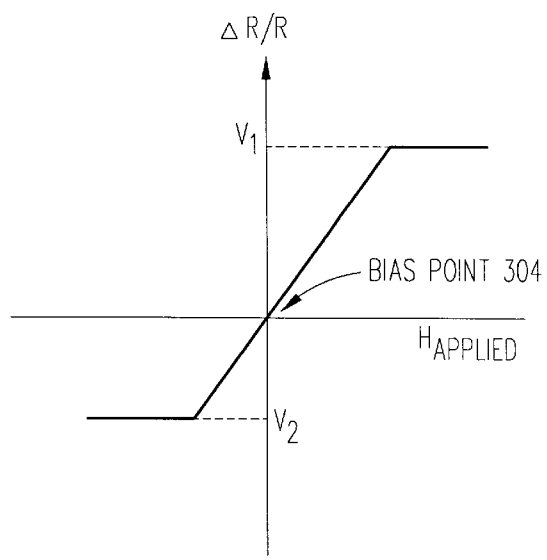
FIG. 3c is a transfer curve for a magnetic tunnel junction sensor having a bias point shifted in the negative direction of the transfer curve so that positive and negative readback signals are asymmetrical about the bias point.
Figure 3B:
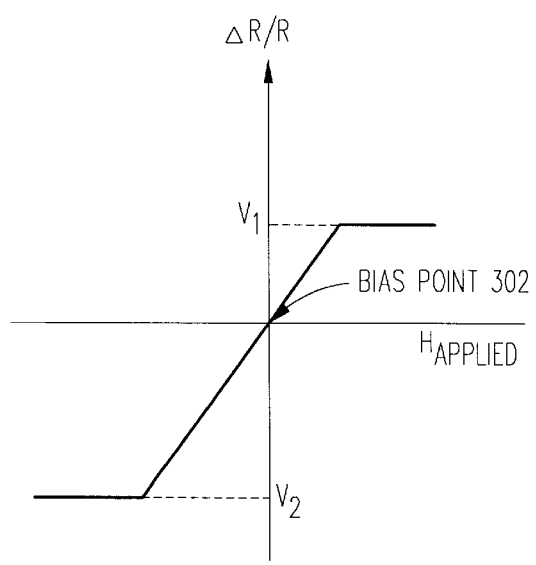
FIG. 3b is a transfer curve for a magnetic tunnel junction sensor having a bias point shifted in the positive direction of the transfer curve so that positive and negative readback signals are asymmetrical about the bias point.
Figure 3A:
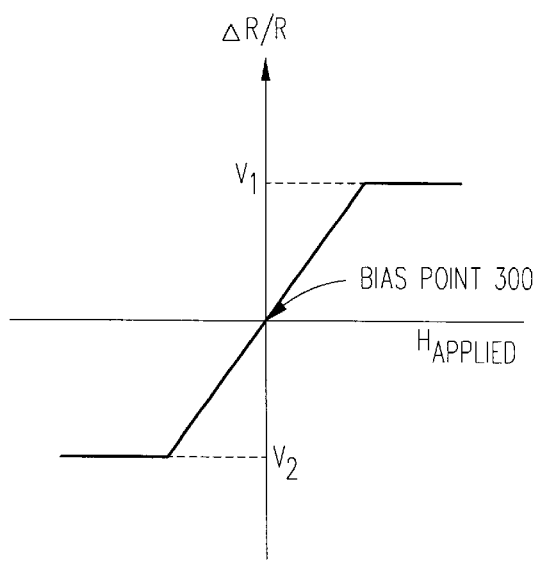
FIG. 3a is a transfer curve for a magnetic tunnel junction sensor having a bias point at the midpoint of the transfer curve so that positive and negative readback signals are symmetrical about a zero bias point.

Various influences on the free layer 728 and consequently various influences on the bias point of the transfer curve for the MTJ sensor 700 are shown in FIG. 8. The influences on the magnetization 764 of the free layer 728 are $H_{FC}$ 804, $H_{dmP}$ 808 and $H_{dmB}$ 806. $H_{FC}$ 804 is due to ferromagnetic coupling between the free layer 728 and the FM2 layer 725, $H_{dmP}$ 808 is due to the net magnetization of the AP-pinned layer 722, and $H_{dmB}$ 806 is due to the net magnetization of the AP-pinned bias layer 716. $H_{dmP}$ 808 and $H_{dmB}$ 806 act in the same direction (away from the ABS) and are counterbalanced by $H_{FC}$ 804 which acts in an opposite direction (toward the ABS). In order for the influence of $H_{FC}$ to exactly or nearly exactly counterbalance the influences of $H_{dmP}$ and $H_{dmB}$, the relative thicknesses of the FM1 and FM2 layers 723 and 725 and of the B1 and B2 layers 717 and 719 must be chosen so that the combined influences of $H_{dmP}$ an $H_{dmB}$ equal or nearly equal the influence of $H_{FC}$. When this condition is met, the desirable symmetric zero bias point on the transfer curve shown in FIG. 3a will be provided. By having the AP-pinned bias layer 716 provide the demagnetization field $H_{dmB}$ 806 which adds to the demagnetization field $H_{dmP}$ 808, the effects of the ferromagnetic coupling field $H_{FC}$ 804 may be counterbalanced with only a small difference in the relative thicknesses of the FM1 and FM2 layers 723 and 725. The small difference in thickness of the antiparallel coupled FM1 and FM2 layers ensures strong exchange coupling of the AP-pinned layer 722 to the AFM layer 720 providing good thermal stability of the MTJ sensor 700.

It will be apparent to those skilled in the art that in the above discussion with respect to FIGS. 7 and 8, the AEM layer 720 alternatively may be set in an opposite direction so that the magnetizations 760 and 758 of the FM1 and B2 layers 723 and 719, respectively, are directed toward the ABS 802. In this case, the magnetizations 762 and 756 will be directed away from the ABS 802, $H_{FC}$ 804 will be directed away from the ABS, and $H_{dmP}$ 808 and $H_{dmB}$ 806 will be directed toward the ABS. With these differences in the directions of the magnetizations of the pinned and bias layers, the operation of the MTJ sensor will be the same as described with respect to FIGS. 7 and 8.

A second embodiment of the present invention is described with reference to FIG. 8a. The second embodiment of the AP-pinned MTJ sensor 800 differs from the first embodiment described with reference to FIGS. 7 and 8 only in the FM1 layer 723 having a thickness greater than the thickness of the FM2 layer 725 and the B2 layer 719 having a thickness greater than the thickness of the B1 layer 717. Since, with the exception of these relative thickness differences of the AP-pinned layers and the AP-pinned bias layers, the structure and processing of the second embodiment is identical to the first embodiment, in the interest of brevity, only the effects of these differences will be described with reference to FIG. 8a.

Since the FM1 layer 723 is chosen to have a greater thickness than the FM2 layer 725 and the B2 layer 719 is chosen have a greater thickness than the B1 layer 717, the net magnetizations of the AP-pinned layer 722 and the AP-pinned bias layer 716 have the same direction away from the ABS 802.

Figure 8A:
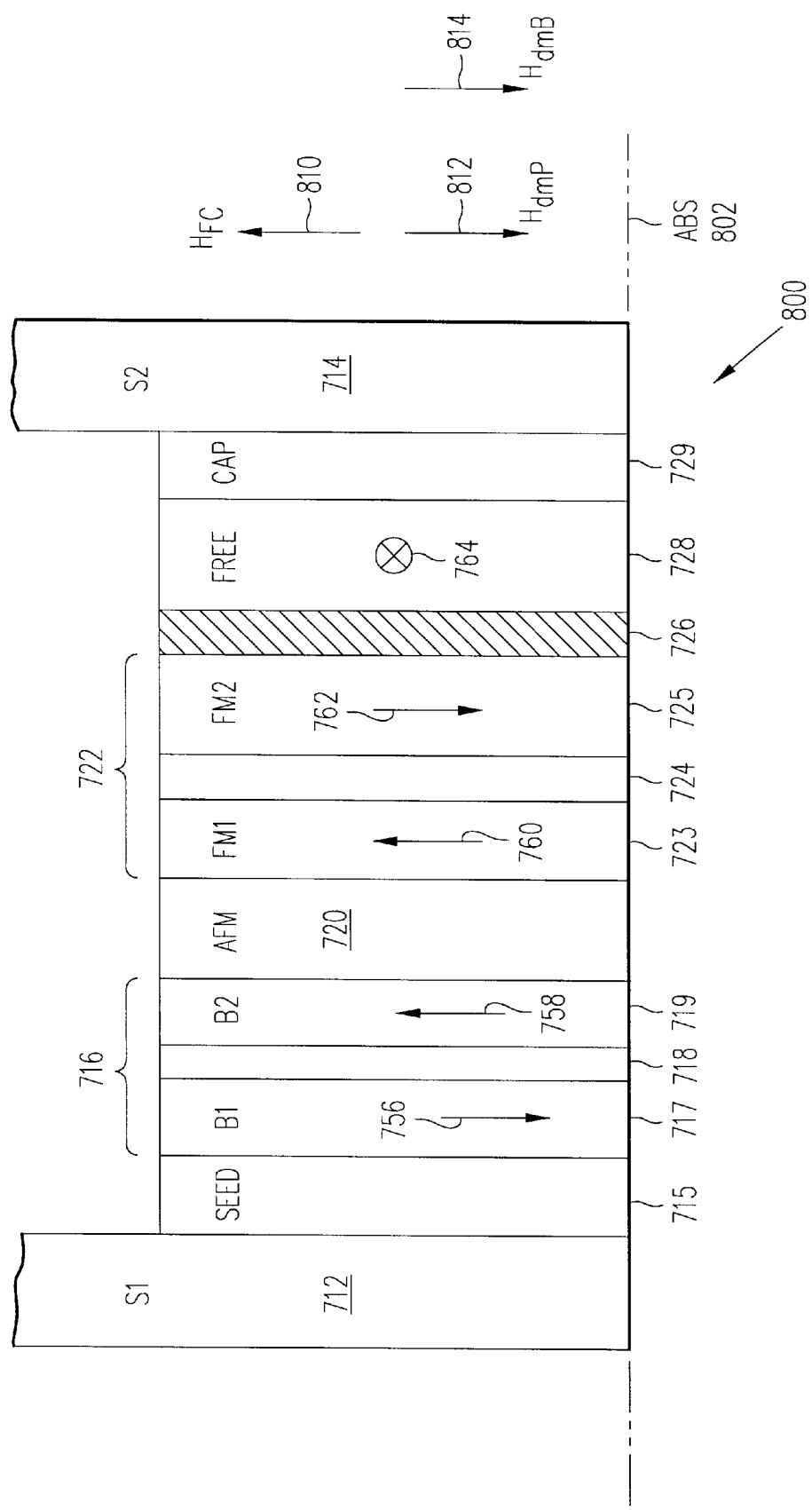
FIG. 8a is a side cross-section view (not to scale) of a second embodiment of an AP-pinned magnetic tunnel junction sensor of the present invention.

Various influences on the free layer 728 and consequently various influences on the bias point of the transfer curve for the MTJ sensor 800 are shown in FIG. 8a. The influences on the magnetization 764 of the free layer 728 are $H_{FC}$ 810, $H_{dmP}$ 812 and $H_{dmB}$ 814. $H_{FC}$ 810 is due to ferromagnetic coupling between the free layer 728 and the FM2 layer 725, $H_{dmP}$ 812 is due to the net magnetization of the AP-pinned layer 722, and $H_{dmB}$ 814 is due to the net magnetization of the AP-pinned bias layer 716. $H_{dmP}$ 812 and $H_{dmB}$ 814 act in the same direction (toward the ABS) and are counterbalanced by $H_{FC}$ 810 which acts in an opposite direction (away from the ABS). In order for the influence of $H_{FC}$ to exactly or nearly exactly counterbalance the influences of $H_{dmP}$ and $H_{dmB}$, the relative thicknesses of the FM1 and FM2 layers 723 and 725 and of the B1 and B2 layers 717 and 719 must be chosen so that the combined influences of $H_{dmP}$ an $H_{dmB}$ equal or nearly equal the influence of $H_{FC}$. When this condition is met, the desirable symmetric zero bias point on the transfer curve shown in FIG. 3a will be provided. By having the AP-pinned bias layer 716 provide the demagnetization field $H_{dmB}$ 814 which adds to the demagnetization field $H_{dmP}$ 812, the effects of the ferromagnetic coupling field $H_{FC}$ 810 may be counterbalanced with only a small difference in the relative thicknesses of the FM1 and FM2 layers 723 and 725. The small difference in thickness of the antiparallel coupled FM1 and FM2 layers ensures strong exchange coupling of the AP-pinned layer 722 to the AFM layer 720 providing good thermal stability of the MTJ sensor 800.

Figure 9:
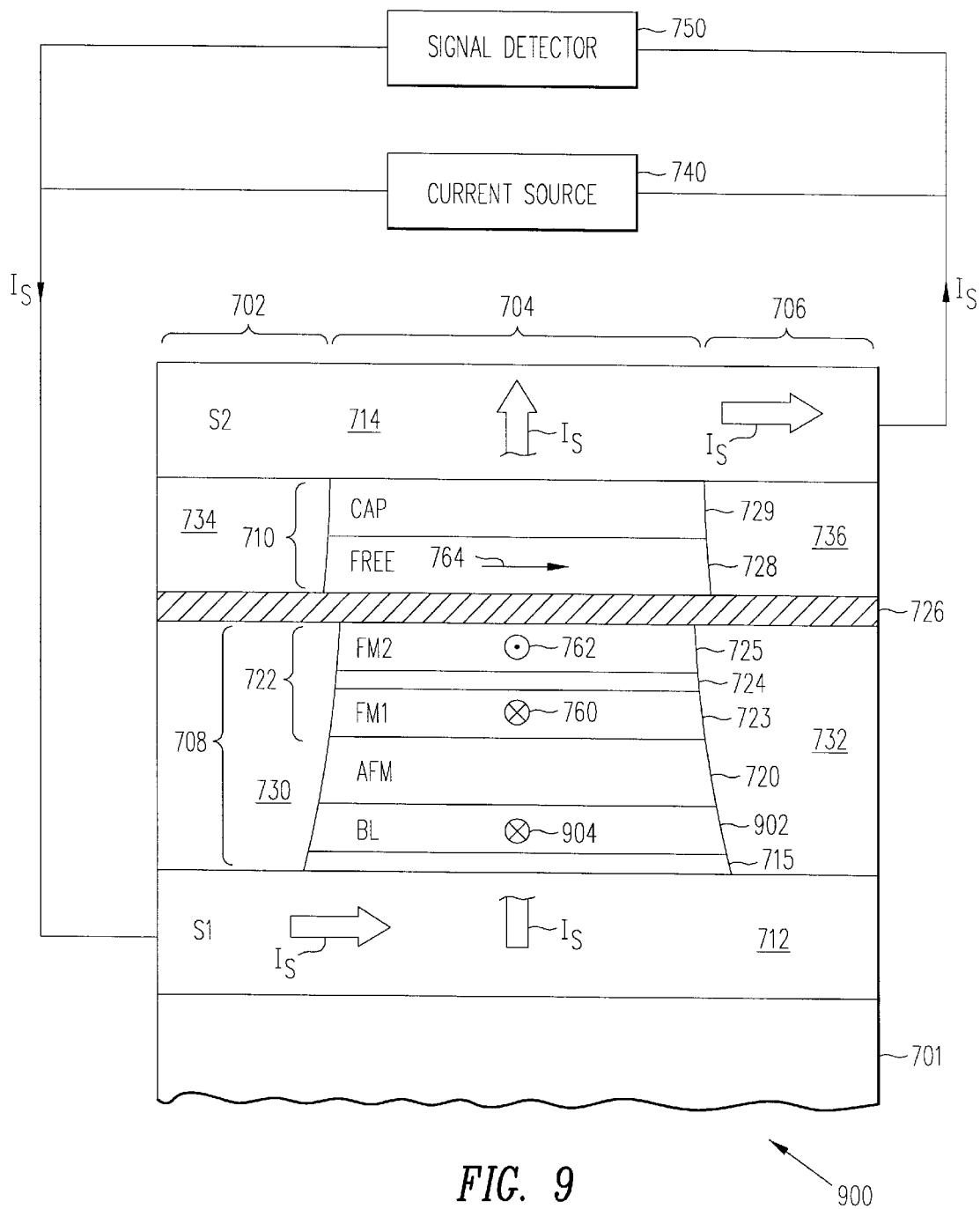
FIG. 9 is an air bearing surface view (not to scale) of a third embodiment of an AP-pinned magnetic tunnel junction sensor of the present invention.

FIG. 9 shows an air bearing surface (ABS) view of an antiparallel (AP)-pinned MTJ sensor according to a third embodiment of the present invention. The MTJ sensor 900 differs from the MTJ sensor 700 shown in FIG. 7 in having a simple bias layer 902 instead of the AP-pinned bias layer 716. The bias layer 902 formed of Ni—Fe having a thickness in the range of 20–50 Å is deposited over the seed layer 715. The bias layer 902 of Ni—Fe provides a good seed film on which the AFM layer 720 is deposited. The AP-pinned layer 722 comprising FM1 and FM2 layers 723 and 725 separated by an APC layer 724 is deposited over the AFM layer 720. The FM1 layer 723 formed of Ni—Fe having a thickness in the range 20–50 Å is deposited on the AFM layer 720. The thickness of the FM1 layer 723 is chosen to be greater than the thickness of the FM2 layer 725 so that magnetization 760 (shown as the tail of an arrow pointing into the plane of the paper) of the FM1 layer 723 is greater than the magnetization 762 (shown as the head of an arrow pointing out of the plane of the paper) of the FM2 layer 725. As a result, the direction of the net magnetization of the AP-pinned layer 722 has the same direction as the magnetization 760 of the FM1 layer 723. The AFM layer 720 is exchange coupled to the AP-pinned layer 722 and to the bias layer 902 providing exchange fields to pin the magnetization directions of the AP-pinned layer 722 and the bias layer 902 perpendicular to the ABS. The AFM layer 720 has its magnetization set so that the magnetization directions 904 and 760 of the bias layer 902 and the FM1 layer 723, respectively, are directed away from (or alternatively, toward) the ABS. In the interest of brevity, only the case where magnetization directions 904 and 760 are directed away from the ABS will be described in detail since the case where the magnetizations are directed toward the ABS is exactly analogous as was explained above with reference to the first embodiment.

Figure 10:
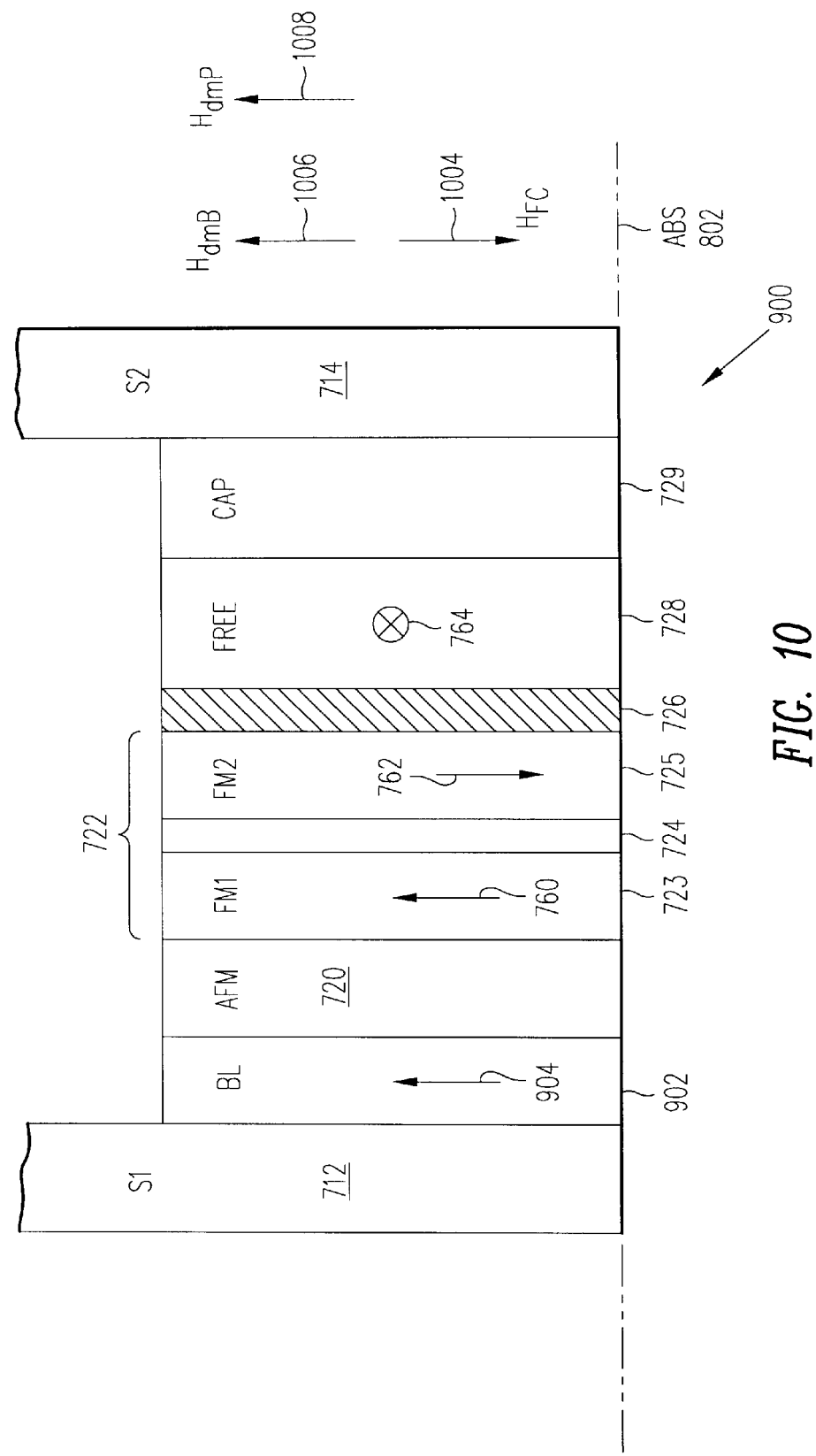
FIG. 10 is a side cross-section view (not to scale) of a third embodiment of an AP-pinned magnetic tunnel junction sensor of the present invention.

FIG. 10 shows a side cross-section view, not to scale, of the third embodiment of the AP-pinned MTJ sensor 900 of the present invention. Since the FM1 layer 723 is chosen to have a greater thickness than the FM2 layer 725, the net magnetization of the AP-pinned layer 722 and the magnetization 904 of the simple bias layer 902 have the same direction away from the ABS 802.

Various influences on the free layer 728 and consequently various influences on the bias point of the transfer curve for the MTJ sensor 900 are shown in FIG. 10. The influences on the magnetization 764 of the free layer 728 are the ferromagnetic coupling field $H_{FC}$ 1004 and the demagnetization fields $H_{dmP}$ 1008 and $H_{dmB}$ 1006. $H_{FC}$ 1004 is due to ferromagnetic coupling between the free layer 728 and the FM2 layer 725, $H_{dmP}$ 1008 is due to the net magnetization of the AP-pinned layer 722, and $H_{dmB}$ 1006 is due to the magnetization 904 of the bias layer 902. $H_{dmP}$ 1008 and $H_{dmB}$ 1006 act in the same direction (away from the ABS) and are counterbalanced by $H_{FC}$ 1004 which acts in an opposite direction (toward the ABS). In order for the influence of $H_{FC}$ to exactly or nearly exactly counterbalance the influences of $H_{dmP}$ and $H_{dmB}$, the relative thicknesses of the FM1 and FM2 layers 723 and 725 and the thickness of the bias layer 902 must be chosen so that the combined influences of $H_{dmP}$ an $H_{dmB}$ equal or nearly equal the influence of $H_{FC}$. When this condition is met, the desirable symmetric zero bias point on the transfer curve shown in FIG. 3a will be provided. By having the bias layer 902 provide the demagnetization field $H_{dmB}$ 1006 which adds to the demagnetization field $H_{dmP}$ 1008, the effects of the ferromagnetic coupling field $H_{FC}$ 1004 may be counterbalanced with only a small difference in the relative thicknesses of the FM1 and FM2 layers 723 and 725. The small difference in thickness of the antiparallel coupled FM1 and FM2 layers ensures strong exchange coupling of the AP-pinned layer 722 to the AFM layer 720 providing good thermal stability of the MTJ sensor 900.

While the present invention has been particularly shown and described with reference to the preferred embodiments, it will be understood to those skilled in the art that various changes in form and detail may be made without departing from the spirit, scope and teaching of the invention. Accordingly, the disclosed invention is to be considered merely as illustrative and limited only as specified in the appended claims.

I claim:

1. A magnetic tunnel junction (MTJ) magnetoresistive sensor, comprising:

an antiparallel (AP)-pinned layer including a first ferromagnetic (FM1) layer, a second ferromagnetic (FM2) layer and an antiparallel coupling (APC) layer disposed between the FM1 and FM2 layers;

a bias layer;

an antiferromagnetic (AFM) layer disposed between said FM1 layer and said bias layer;

a ferromagnetic free layer; and a tunnel barrier layer disposed between said FM2 layer and said free layer wherein the bias layer comprises:

a ferromagnetic first bias layer;

a ferromagnetic second bias layer adjacent to the AFM layer; and an antiparallel coupling (APC) layer disposed between the first and second bias layers.

2. The MTJ sensor as recited in claim 1, wherein the FM2 layer has a thickness greater than the thickness of the FM1 layer and the first bias layer has a thickness greater than the thickness of the second bias layer.

3. The MTJ sensor as recited in claim 1, wherein the FM1 layer has a thickness greater than the thickness of the FM2 layer and the second bias layer has a thickness greater than the thickness of the first bias layer.

4. A magnetic tunnel junction (MTJ) magnetoresistive sensor which has positive and negative readback signals about a bias point of a transfer curve upon sensing positive and negative magnetic incursions from a moving magnetic medium, said MTJ sensor comprising:

a ferromagnetic free layer having a magnetization that is free to rotate in first and second directions from a position which corresponds to said bias point upon sensing positive and negative magnetic incursions, respectively;

an antiparallel (AP)-pinned layer having a magnetization that is pinned in a pinned direction, said AP-pinned layer including:

a first ferromagnetic (FM1) pinned layer;

a second ferromagnetic (FM2) pinned layer; and an antiparallel coupling (APC) layer disposed between the FM1 layer and the FM2 layer;

a ferromagnetic bias layer;

an antiferromagnetic (AFM) layer disposed between the bias layer and the FM1 layer which pins the magnetization of the bias layer and the AP-pinned layer along said pinned direction;

a tunnel barrier layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the MTJ sensor to a sense current;

the direction of the magnetization of the free layer being influenced by a ferromagnetic coupling field ($H_{FC}$) from the FM2 layer, a demagnetization field ($H_{dmP}$) from the AP-pinned layer and a demagnetization field ($H_{dmB}$) from the bias layer; and the demagnetization fields $H_{dmP}$ and $H_{dmB}$ adding together at the free layer and having such magnitude and direction that a net influence of $H_{FC}$, $H_{dmP}$ and $H_{dmB}$ on the free layer is substantially zero.

5. The MTJ sensor as recited in claim 4, wherein in the absence of positive and negative magnetic incursions the magnetization of said AP-pinned layer is pinned in a direction substantially perpendicular to the direction of magnetization of said free layer.

6. The MTJ sensor as recited in claim 4, wherein the AFM layer is selected from the group of materials consisting of Pt—Mn, Ir—Mn and Pt—Pd—Mn.

7. The MTJ sensor as recited in claim 4, wherein the bias layer is made of Ni—Fe.

8. The MTJ sensor as recited in claim 4, wherein the FM1 layer has a thickness greater than the thickness of the FM2 layer.

9. The MTJ sensor as recited in claim 4, wherein the bias layer comprises:
a ferromagnetic first bias layer;
a ferromagnetic second bias layer adjacent to the AFM layer; and
an antiparallel coupling (APC) layer disposed between the first and second bias layers.

10. The MTJ sensor as recited in claim 9, wherein the FM1 and FM2 layer are made of Ni—Fe.

11. The MTJ sensor as recited in claim 9, wherein the FM2 layer has a thickness greater than the thickness of the FM1 layer and the first bias layer has a thickness greater than the thickness of the second bias layer.

12. The MTJ sensor as recited in claim 9, wherein the FM1 layer has a thickness greater than the thickness of the FM2 layer and the second bias layer has a thickness greater than the thickness of the first bias layer.

13. A magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a magnetic tunnel junction (MTJ) sensor and first and second shield layers, the MTJ sensor being sandwiched between the first and second shield layers, the MTJ sensor including:
an antiparallel (AP)-pinned layer including a first ferromagnetic (FM1) layer, a second ferromagnetic (FM2) layer and an antiparallel coupling (APC) layer disposed between the FM1 and FM2 layers;
a bias layer;
an antiferromagnetic (AFM) layer disposed between said FM1 layer and said bias layer;
a ferromagnetic free layer; and
a tunnel barrier layer disposed between said FM2 layer and said free layer; and
an insulation layer disposed between the second shield layer of the read head and the first pole piece layer of the write head; wherein said bias layer comprises:
a ferromagnetic first bias layer;
a ferromagnetic second bias layer adjacent to the AFM layer; and
an antiparallel coupling (APC) layer disposed between the first and second bias layers.

14. The magnetic read/write head as recited in claim 13, wherein the FM2 layer has a thickness greater than the thickness of the FM1 layer and the first bias layer has a thickness greater than the thickness of the second bias layer.

15. The magnetic read/write head as recited in claim 13, wherein the FM1 layer has a thickness greater than the thickness of the FM2 layer and the second bias layer has a thickness greater than the thickness of the first bias layer.

16. A magnetic read/write head comprising:
a write head including:
at least one coil layer and an insulation stack, the coil layer being embedded in the insulation stack;
first and second pole piece layers connected at a back gap and having pole tips with edges forming a portion of an air bearing surface (ABS);
the insulation stack being sandwiched between the first and second pole piece layers; and
a write gap layer sandwiched between the pole tips of the first and second pole piece layers and forming a portion of the ABS;
a read head including:
a magnetic tunnel junction (MTJ) sensor and first and second shield layers, the MTJ sensor being sandwiched between the first and second shield layers, the MTJ sensor having having positive and negative readback signals about a bias point of a transfer curve upon sensing positive and negative magnetic incursions from a moving magnetic medium, said MTJ sensor comprising:
a ferromagnetic free layer having a magnetization that is free to rotate in first and second directions from a position which corresponds to said bias point upon sensing positive and negative magnetic incursions, respectively;
an antiparallel (AP)-pinned layer having a magnetization that is pinned in a pinned direction, said AP-pinned layer including:
a first ferromagnetic (FM1) pinned layer;
a second ferromagnetic (FM2) pinned layer; and
an antiparallel coupling (APC) layer disposed between the FM1 layer and the FM2 layer;
a ferromagnetic bias layer;
an antiferromagnetic (AFM) layer disposed between the bias layer and the FM1 layer which pins the magnetization of the bias layer and the AP-pinned layer along said pinned direction;
a tunnel barrier layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the MTJ sensor to a sense current;
the direction of the magnetization of the free layer being influenced by a ferromagnetic coupling field ($H_{FC}$) from the FM2 layer, a demagnetization field ($H_{dmP}$) from the AP-pinned layer and a demagnetization field ($H_{dmB}$) from the bias layer; and the demagnetization fields $H_{dmP}$ and $H_{dmB}$ adding together at the free layer and having such magnitude and direction that a net influence of $H_{FC}$, and $H_{dmP}$ $H_{dmB}$ on the free layer is substantially zero; and an insulation layer disposed between the second shield layer of the read head and the first pole piece layer of the write head.

17. The magnetic read/write head as recited in claim 16, wherein in the absence of positive and negative magnetic incursions the magnetization of said AP-pinned layer is pinned in a direction substantially perpendicular to the direction of magnetization of said free layer.

18. The magnetic read/write head as recited in claim 16, wherein the FM1 layer has a thickness greater than the thickness of the FM2 layer.

19. The magnetic read/write head as recited in claim 16, wherein the bias layer comprises:
    a ferromagnetic first bias layer;
    a ferromagnetic second bias layer adjacent to the AFM layer; and
    an antiparallel coupling (APC) layer disposed between the first and second bias layers.

20. Th magnetic read/write head as recited in claim 19, wherein the FM2 layer has a thickness greater than the thickness of the FM1 layer and the first bias layer has a thickness greater than the thickness of the second bias layer.

21. The magnetic read/write head as recited in claim 19, wherein the FM1 layer has a thickness greater than the thickness of the FM2 layer and the second bias layer has a thickness greater than the thickness of the first bias layer.

22. A disk drive system comprising:
    a magnetic recording disk;
    a magnetic read/write head for magnetically recording data on the magnetic recording disk and for sensing magnetically recorded data on the magnetic recording disk, said magnetic read/write head comprising:
        a write head including:
            at least one coil layer and an insulation stack, the coil layer being embedded in the insulation stack;
            first and second pole piece layers connected at a back gap and having pole tips with edges forming a portion of an air bearing surface (ABS);
            the insulation stack being sandwiched between the first and second pole piece layers; and
            a write gap layer sandwiched between the pole tips of the first and second pole piece layers and forming a portion of the ABS;
        a read head including:
            a magnetic tunnel junction (MTJ) sensor and first and second shield layers, the MTJ sensor being sandwiched between the first and second shield layers, the MTJ sensor including:
                an antiparallel (AP)-pinned layer including a first ferromagnetic (FM1) layer, a second ferromagnetic (FM2) layer and an antiparallel coupling (APC) layer disposed between the FM1 and FM2 layers;
                a bias layer;
                an antiferromagnetic (AFM) layer disposed between said FM1 layer and said bias layer;
                a ferromagnetic free layer; and
                a tunnel barrier layer disposed between said FM2 layer and said free layer; and
            an insulation layer disposed between the second shield layer of the read head and the first pole piece layer of the write head;
    an actuator for moving said magnetic read/write head across the magnetic disk so that the read/write head may access different regions of the magnetic recording disk; and
    a recording channel coupled electrically to the write head for magnetically recording data on the magnetic recording disk and to the MTJ sensor of the read head for detecting changes in resistance of the MTJ sensor caused by rotation of the magnetization axis of the free ferromagnetic layer relative to the fixed magnetization of the AP-pinned layer in response to magnetic fields from the magnetically recorded data; wherein said bias layer comprises:
        a ferromagnetic first bias layer;
        a ferromagnetic second bias layer adjacent to the AFM layer; and
        an antiparallel coupling (APC) layer disposed between the first and second bias layers.

23. A disk drive system comprising:
    a magnetic recording disk;
    a magnetic read/write head for magnetically recording data on the magnetic recording disk and for sensing magnetically recorded data on the magnetic recording disk, said magnetic read/write head comprising:
        a write head including:
            at least one coil layer and an insulation stack, the coil layer being embedded in the insulation stack;
            first and second pole piece layers connected at a back gap and having pole tips with edges forming a portion of an air bearing surface (ABS);
            the insulation stack being sandwiched between the first and second pole piece layers; and
            a write gap layer sandwiched between the pole tips of the first and second pole piece layers and forming a portion of the ABS;
        a read head including:
            a magnetic tunnel junction (MTJ) sensor and first and second shield layers, the MTJ sensor being sandwiched between the first and second shield layers, the MTJ sensor including:
                an antiparallel (AP)-pinned layer including a first ferromagnetic (FM1) layer, a second ferromagnetic (FM2) layer and an antiparallel coupling (APC) layer disposed between the FM1 and FM2 layers;
                a bias layer;
                an antiferromagnetic (AFM) layer disposed between said FM1 layer and said bias layer;
                a ferromagnetic free layer; and
                a tunnel barrier layer disposed between said FM2 layer and said free layer; and
            an insulation layer disposed between the second shield layer of the read head and the first pole piece layer of the write head;
    an actuator for moving said magnetic read/write head across the magnetic disk so that the read/write head may access different regions of the magnetic recording disk; and
    a recording channel coupled electrically to the write head for magnetically recording data on the magnetic recording disk and to the MTJ sensor of the read head for detecting changes in resistance of the MTJ sensor caused by rotation of the magnetization axis of the free ferromagnetic layer relative to the fixed magnetization of the AP-pinned layer in response to magnetic fields from the magnetically recorded data; wherein the FM2 layer has a thickness greater than the thickness of the FM1 layer and the first bias layer has a thickness greater than the thickness of the second bias layer.

24. A disk drive system comprising:
a magnetic recording disk;
a magnetic read/write head for magnetically recording data on the magnetic recording disk and for sensing magnetically recorded data on the magnetic recording disk, said magnetic read/write head comprising:
   a write head including:
      at least one coil layer and an insulation stack, the coil layer being embedded in the insulation stack;
      first and second pole piece layers connected at a back gap and having pole tips with edges forming a portion of an air bearing surface (ABS);
      the insulation stack being sandwiched between the first and second pole piece layers; and
      a write gap layer sandwiched between the pole tips of the first and second pole piece layers and forming a portion of the ABS;
   a read head including:
      a magnetic tunnel junction (MTJ) sensor and first and second shield layers, the MTJ sensor being sandwiched between the first and second shield layers, the MTJ sensor including:
         an antiparallel (AP)-pinned layer including a first ferromagnetic (FM1) layer, a second ferromagnetic (FM2) layer and an antiparallel coupling (APC) layer disposed between the FM1 and FM2 layers;
         a bias layer;
         an antiferromagnetic (AFM) layer disposed between said FM1 layer and said bias layer;
         a ferromagnetic free layer; and
         a tunnel barrier layer disposed between said FM2 layer and said free layer; and
      an insulation layer disposed between the second shield layer of the read head and the first pole piece layer of the write head;
an actuator for moving said magnetic read/write head across the magnetic disk so that the read/write head may access different regions of the magnetic recording disk; and
a recording channel coupled electrically to the write head for magnetically recording data on the magnetic recording disk and to the MTJ sensor of the read head for detecting changes in resistance of the MTJ sensor caused by rotation of the magnetization axis of the free ferromagnetic layer relative to the fixed magnetization of the AP-pinned layer in response to magnetic fields from the magnetically recorded data; wherein the FM1 layer has a thickness greater than the thickness of the FM2 layer and the second bias layer has a thickness greater than the thickness of the first bias layer.

25. A disk drive system comprising:
a magnetic recording disk;
a magnetic read/write head for magnetically recording data on the magnetic recording disk and for sensing magnetically recorded data on the magnetic recording disk, said magnetic read/write head comprising:
   a write head including:
      at least one coil layer and an insulation stack, the coil layer being embedded in the insulation stack;
      first and second pole piece layers connected at a back gap and having pole tips with edges forming a portion of an air bearing surface (ABS);
      the insulation stack being sandwiched between the first and second pole piece layers; and
      a write gap layer sandwiched between the pole tips of the first and second pole piece layers and forming a portion of the ABS;
   a read head including:
      a magnetic tunnel junction (MTJ) sensor and first and second shield layers, the MTJ sensor being sandwiched between the first and second shield layers, the MTJ sensor having having positive and negative readback signals about a bias point of a transfer curve upon sensing positive and negative magnetic incursions from a moving magnetic medium, said MTJ sensor comprising:
         a ferromagnetic free layer having a magnetization that is free to rotate in first and second directions from a position which corresponds to said bias point upon sensing positive and negative magnetic incursions, respectively;
         an antiparallel (AP)-pinned layer having a magnetization that is pinned in a pinned direction, said AP-pinned layer including:
            a first ferromagnetic (FM1) pinned layer;
            a second ferromagnetic (FM2) pinned layer; and
            an antiparallel coupling (APC) layer disposed between the FM1 layer and the FM2 layer;
         a ferromagnetic bias layer;
         an antiferromagnetic (AFM) layer disposed between the bias layer and the FM1 layer which pins the magnetization of the bias layer and the AP-pinned layer along said pinned direction;
         a tunnel barrier layer disposed between the free layer and the FM2 layer so that upon sensing positive and negative magnetic incursions the magnetization of the free layer rotates in said first and second directions relative to the pinned direction of the magnetization of the AP-pinned layer resulting in an increase or decrease, respectively, in the magnetoresistance of the MTJ sensor to a sense current;
         the direction of the magnetization of the free layer being influenced by a ferromagnetic coupling field ($H_{FC}$) from the FM2 layer, a demagnetization field ($H_{dmP}$) from the AP-pinned layer and a demagnetization field ($H_{dmB}$) from the bias layer; and
         the demagnetization fields $H_{dmP}$ and $H_{dmB}$ adding together at the free layer and having such magnitude and direction that a net influence of $H_{FC}$, and $H_{dmP}$ and $H_{dmB}$ on the free layer is substantially zero; and
      an insulation layer disposed between the second shield layer of the read head and the first pole piece layer of the write head;
an actuator for moving said magnetic read/write head across the magnetic disk so that the read/write head may access different regions of the magnetic recording disk; and
a recording channel coupled electrically to the write head for magnetically recording data on the magnetic recording disk and to the MTJ sensor of the read head for detecting changes in resistance of the MTJ sensor caused by rotation of the magnetization axis of the free ferromagnetic layer relative to the fixed magnetization of the AP-pinned layer in response to magnetic fields from the magnetically recorded data.

26. The disk drive system as recited in claim 25, wherein in the absence of positive and negative magnetic incursions the magnetization of said AP-pinned layer is pinned in a direction substantially perpendicular to the direction of magnetization of said free layer.

27. The disk drive system as recited in claim 25, wherein the FM1 layer has a thickness greater than the thickness of the FM2 layer.

28. The disk drive system as recited in claim 25, wherein the bias layer comprises:

a ferromagnetic first bias layer;

a ferromagnetic second bias layer adjacent to the AFM layer; and an antiparallel coupling (APC) layer disposed between the first and second bias layers.

29. The disk drive system as recited in claim 28, wherein the FM2 layer has a thickness greater than the thickness of the FM1 layer and the first bias layer has a thickness greater than the thickness of the second bias layer.

30. The disk drive system as recited in claim 28, wherein the FM1 layer has a thickness greater than the thickness of the FM2 layer and the second bias layer has a thickness greater than the thickness of the first bias layer.

* * * * *